United States Patent
Anai et al.

(10) Patent No.: US 12,233,463 B2
(45) Date of Patent: Feb. 25, 2025

(54) COMPOSITION FOR PRESSURE BONDING, AND BONDED STRUCTURE OF CONDUCTIVE BODIES AND PRODUCTION METHOD THEREFOR

(71) Applicant: Mitsui Mining & Smelting Co., Ltd., Tokyo (JP)

(72) Inventors: Kei Anai, Ageo (JP); Shinichi Yamauchi, Ageo (JP); Jung-Lae Jo, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 794 days.

(21) Appl. No.: 17/424,350

(22) PCT Filed: Mar. 25, 2020

(86) PCT No.: PCT/JP2020/013254
§ 371 (c)(1),
(2) Date: Jul. 20, 2021

(87) PCT Pub. No.: WO2020/203530
PCT Pub. Date: Oct. 8, 2020

(65) Prior Publication Data
US 2022/0118546 A1   Apr. 21, 2022

(30) Foreign Application Priority Data

Mar. 29, 2019  (JP) .................. 2019-068288

(51) Int. Cl.
| | | |
|---|---|---|
| B22F 7/06 | (2006.01) | |
| B22F 1/052 | (2022.01) | |
| B22F 1/054 | (2022.01) | |
| B22F 1/068 | (2022.01) | |
| B22F 1/107 | (2022.01) | |
| B22F 1/145 | (2022.01) | |
| B23K 20/02 | (2006.01) | |
| B23K 20/22 | (2006.01) | |
| H01L 23/00 | (2006.01) | |

(52) U.S. Cl.
CPC .............. B22F 7/064 (2013.01); B22F 1/052 (2022.01); B22F 1/054 (2022.01); B22F 1/0551 (2022.01); B22F 1/056 (2022.01); B22F 1/068 (2022.01); B22F 1/107 (2022.01); B22F 1/147 (2022.01); B23K 20/02 (2013.01); B23K 20/22 (2013.01); H01L 24/83 (2013.01)

(58) Field of Classification Search
CPC .......... B22F 1/068; B22F 1/107; B23K 20/02
See application file for complete search history.

(56) References Cited

U.S. PATENT DOCUMENTS

| 10,141,283 B2 * | 11/2018 | Inoue ................. B22F 1/068 |
|---|---|---|
| 2017/0140847 A1 | 5/2017 | Kamikoriyama et al. |
| 2017/0294396 A1 | 10/2017 | Inoue et al. |
| 2018/0269074 A1 | 9/2018 | Kamikoriyama et al. |
| 2018/0273808 A1 | 9/2018 | Kamakura et al. |
| 2018/0297112 A1 | 10/2018 | Nakajima |

FOREIGN PATENT DOCUMENTS

| EP | 3348337 A1 | 7/2018 |
|---|---|---|
| JP | 2015-76232 A | 4/2015 |
| JP | 2015-90900 A | 5/2015 |
| JP | 2018-501657 A | 1/2018 |
| TW | 2017-14499 A | 4/2017 |
| WO | 2015-115139 A1 | 8/2015 |
| WO | 2017-085909 A1 | 5/2017 |
| WO | 2020-032161 A1 | 2/2020 |

OTHER PUBLICATIONS

International Search Report (English and Japanese) of the International Searching Authority issued in PCT/JP2020/013254, mailed Jun. 23, 2020; ISA/JP (5 pages).

* cited by examiner

*Primary Examiner* — Brian D Walck
*Assistant Examiner* — Nazmun Nahar Shams
(74) *Attorney, Agent, or Firm* — Harness, Dickey & Pierce, P.L.C.

(57) ABSTRACT

A composition for pressure bonding contains a metal powder and a solid reducing agent and has a compressibility of 10% to 90%, the compressibility being expressed by a relationship formula using the thickness A of a dried coating film formed by drying the composition in an air atmosphere at 110° C. under atmospheric pressure for 20 minutes and the thickness B of a sintered body formed by treating the dried coating film in a nitrogen atmosphere at 280° C. under a pressure of 6 MPa for 20 minutes. The solid reducing agent may be BIS-TRIS. Also provided is a bonded structure of conductors in which a bonding portion via which two conductors are bonded together is formed by treating, under pressure, the two conductors and a coating film formed of the composition for pressure bonding provided therebetween.

7 Claims, No Drawings

COMPOSITION FOR PRESSURE BONDING, AND BONDED STRUCTURE OF CONDUCTIVE BODIES AND PRODUCTION METHOD THEREFOR

CROSS REFERENCE TO RELATED APPLICATIONS

This application is a U.S. National Phase application under 35 U.S.C. 371 of International Application No. PCT/JP2020/013254, filed on Mar. 25, 2020, which claims priority to Japanese Patent Application No. 2019-068288, filed on Mar. 29, 2019. The entire disclosures of the above applications are expressly incorporated by reference herein.

BACKGROUND

Technical Field

The present invention relates to a composition for pressure bonding, a bonded structure of conductors, and a method for producing the bonded structure.

Related Art

With the recent global trend for energy efficiency and conservation, semiconductor devices called power devices have been widely used as power conversion/control devices such as inverters. Unlike integrated circuits such as memories and microprocessors, power devices are used to control high current and high voltage and thus tend to generate a very large amount of heat during driving. Therefore, in order to prevent semiconductor devices from being damaged by generated heat, semiconductor packages need to be provided with countermeasures against heat, such as a cooling system.

Also, in order to improve the efficiency and compactness of semiconductor devices, an electronic component called a power module is used in which a plurality of semiconductor devices are mounted on a bonded body in which copper is provided on both surfaces of a ceramic plate. However, the smaller the size of power modules, the more likely the heat generated during driving is to accumulate therein, and, for this reason, sufficient reliability may not be achieved if a low heat-resistance bonding material such as a soldering material is used.

To address the above-described problems, bonding materials formed by sintering a metal such as silver or copper have garnered attention as materials that can replace soldering materials. For example, EP 3348337A1 discloses a copper paste for bonding, the copper paste including sub-micro copper particles and flake-shaped copper particles as well as a dispersion medium. EP 3348337A1 also discloses that a bonded body can be manufactured by sintering a laminated body of this paste and relevant members without pressure.

US 2018/273808A1 discloses the method for producing a sheet-like sintered body by heating a pre-sintering laminated body including a substrate, a chip, and a pre-sintering layer containing metal particles, such as silver particles or copper particles, under pressure.

With the non-pressure bonding method disclosed in EP 3348337A1, it is necessary that the mounting of a semiconductor device and the subsequent sintering are performed after the paste is applied while maintaining its fluidity. If the sintering is performed in this state, a solvent in the paste gasifies due to an increase in temperature during the sintering. As a result, a void may form in a bonding portion, the paste may leak to an unintended portion between conductors, and the bonding portion formed of a sintered body of the paste may have a nonuniform thickness. That is to say, a phenomenon (chip tilt) in which the semiconductor device is tilted becomes likely to occur, which leads to a reduction in semiconductor package reliability.

The method disclosed in US 2018/273808A1 is a method for bonding while applying a pressure; however, since this method handles sheet-like materials, a new facility and a new production step need to be introduced, which is not preferable in terms of cost and production efficiency. Moreover, in the bonding method of US 2018/273808A1, the bonding strength in the case where a plurality of conductors such as semiconductor devices are collectively bonded is not considered at all.

Therefore, an object of the present invention is to provide a composition for pressure bonding that can stably realize high bonding strength when a plurality of bonding portions are collectively formed, as well as a conductor using the composition.

SUMMARY

The present invention provides a composition for pressure bonding, including a metal powder and a solid reducing agent, wherein the composition has a compressibility of 10% to 90%, the compressibility being expressed by the formula (X) below:

$$\text{Compressibility (\%)} = ((A-B)/A) \times 100 \qquad (X)$$

wherein A represents a thickness (μm) of a dried coating film formed by drying the composition in an air atmosphere at 110° C. under atmospheric pressure for 20 minutes, and B represents a thickness (μm) of a sintered body formed by treating the dried coating film in a nitrogen atmosphere at 280° C. under a pressure of 6 MPa for 20 minutes.

Also, the present invention provides a method for producing a bonded structure of conductors, the method including:

applying the composition for pressure bonding to a surface of a first conductor to form a coating film;

drying the coating film to form a dried coating film;

stacking a second conductor on the dried coating film to form a stack; and subsequently sintering the metal powder of the stack in a nitrogen atmosphere at less than 300° C. under a pressure of 0.001 MPa or more, to thereby form a bonding portion via which the first conductor and the second conductor are bonded together.

Furthermore, the present invention provides a bonded structure of conductors, the bonded structure having a bonding portion formed by sintering the metal powder contained in the composition for pressure bonding, wherein two conductors are electrically connected to each other via the bonding portion,
the bonding portion contains copper, and
a structure (3) below is formed in the bonding portion:

[Chem. 1]

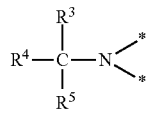

(3)

wherein $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group, and * represents a copper-binding site.

DETAILED DESCRIPTION

Hereinafter, the present invention will be described based on preferred embodiments thereof. The composition for pressure bonding of the present invention contains a metal powder and a solid reducing agent, and is favorably used to pressure bond two conductors together. When provided between two conductors and sintered in this state, the composition for pressure bonding is formed into a conductive film, thereby bonding the two conductors together and electrically connecting the conductors to each other. The term "pressure" as used in the present invention means that a pressure of 0.001 MPa or more is intentionally applied to members to be bonded together from the outside of those members, and is intended to exclude any change in atmospheric pressure and any pressure composed only of pressure applied due to the weight of members such as the conductors. From the viewpoint of preventing cracking and breakage of a dried coating film, which will be described later, the pressure to be applied is preferably 20 MPa or less.

A feature of the composition for pressure bonding of the present invention is that there is a predetermined relationship between the thickness of a dried coating film formed by drying the composition under atmospheric pressure and the thickness of a sintered body formed by performing a predetermined treatment on the dried coating film. More specifically, when the thickness (μm) of a dried coating film formed by treating the composition for pressure bonding containing the metal powder and the solid reducing agent in an air atmosphere at 110° C. under atmospheric pressure for 20 minutes is A, and the thickness (μm) of a sintered body formed by treating the dried coating film in a nitrogen atmosphere at 280° C. under a pressure of 6 MPa for 20 minutes is B, the compressibility expressed by the formula (X) below is preferably from 10% to 90%:

Compressibility (%)=((A−B)/A)×100 (X).

With the composition for pressure bonding of the present invention having the above-described properties, a coating film formed by applying the composition for pressure bonding to a conductor, such as a substrate, constitutes a layer that has a bulky structure, and functions like a cushioning material. By pressure bonding conductors together via such a coating film, it is possible to sufficiently bond the conductors without being affected by variation in thickness of the conductors to be bonded together. As a result, even when, for example, conductors have large areas, or a plurality of small conductors such as semiconductor devices are to be simultaneously pressure bonded, the conductors can be bonded with high adhesion and high stability without depending on the sizes and the arrangement positions of the conductors, and also high bonding strength can be realized. In order that these effects can be even more markedly achieved, the compressibility expressed by the formula (X) above is more preferably 20% or more, and even more preferably 25% or more. On the other hand, the upper limit of the compressibility is more preferably 85%, and even more preferably 75%.

The thickness A of the dried coating film and the thickness B of the sintered body that have been described above can be measured using respective methods below.

The thickness A of the dried coating film can be measured in a contactless state, without being affected by a change in film thickness caused by a probe coming into contact with the film, by using, for example, an interference microscope or the like. Specifically, the composition for pressure bonding is applied to a central portion with a size of 10 mm square, of a conductive substrate (20 mm square) to form a coating film, and the coating film is then dried under the above-described conditions to form a dried coating film. The substrate with the dried coating film formed on one surface thereof is subjected to the following measurements using a 3D profiler available from Zygo Corporation. In a square frame-shaped area surrounding the dried coating film (i.e., an area that is demarcated by a 15.0 mm square and a 12.5 mm square around the center of the substrate and where the dried coating film is not present), a plurality of pieces of data on the thickness of the substrate are extracted at intervals of 5.9 μm lengthwise and widthwise in the horizontal direction, and an average substrate thickness D1 is calculated. Subsequently, in a 5 mm square area at the center of the substrate, a plurality of pieces of data on the total thickness of the dried coating film and the substrate are extracted at intervals of 5.9 μm lengthwise and widthwise in the horizontal direction, and an average thickness D2 is calculated. Then, a value obtained by subtracting the average thickness D1 from the average thickness D2 is used as the thickness A of the dried coating film.

The thickness B of the sintered body can be measured by polishing the sintered body, which has been obtained by treating the dried coating film under the above-described conditions, perpendicularly to a planar direction of the sintered body until reaching a center portion of the conductive substrate, then observing the polished cross section using a scanning electron microscope (SEM), and actually measuring the thickness. Specifically, for example, in the case of a bonded structure in which a sintered body is provided between two conductors, the bonded structure is embedded in a resin, mechanical polishing with abrasive paper is performed perpendicularly to the planar direction of the bonded structure until reaching a center portion of one of the conductors, and then, ion polishing with Ar is performed using a cross section polisher to thereby expose a cross section of the sintered body. The thus exposed cross section of the sintered body is observed under the SEM, and the minimum thickness observed in the field of view is used as the thickness B of the sintered body.

The thickness A of the dried coating film, from which the compressibility is calculated, is preferably 5 μm or more, more preferably 7 μm or more, and even more preferably 10 μm or more. Also, the thickness A of the dried coating film is preferably 500 μm or less, more preferably 400 μm or less, and even more preferably 300 μm or less.

The thickness B of the sintered body is preferably 5 µm or more, more preferably 7 µm or more, and even more preferably 10 µm or more, on condition that the thickness B of the sintered body is smaller than the thickness A of the dried coating film. Also, the thickness B of the sintered body is preferably 350 µm or less, more preferably 300 µm or less, and even more preferably 250 µm or less. Such dried coating films and sintered bodies can be adjusted as appropriate by changing, for example, the shape and/or the amount of metal particles contained in the composition used to form these films, or the content ratio of the solid reducing agent, which will be described later.

The metal powder contained in the composition for pressure bonding is an assemblage of metal particles. In the following description, the term "metal powder" may refer to metal particles or an assemblage of metal particles, depending on the context.

It is preferable that the metal powder contains at least one metal selected from gold, silver, copper, palladium, aluminum, nickel, and tin. These metals may be contained in the form of, for example, an assemblage of metal particles made of substantially a single metal, an assemblage in which a plurality of types of metal particles made of substantially a single metal are mixed, or an assemblage in which a plurality of types of metal particles made of different metals are mixed.

From the viewpoint of achieving both a reduction in the cost and an improvement in the heat resistance of the bonded structure, it is more preferable that, among the aforementioned metals, at least one metal selected from silver, copper, nickel, and tin is contained in the metal powder. In addition, if the metal powder contains copper, it is preferable that copper is contained in an amount of 70 mass % or more of a metal component contained in the sintered body, from the viewpoint of improving the conductivity. Note that, in the case where the metal powder contains a plurality of metal species, the copper content is calculated using the total mass of the plurality of metals as a reference. Also, the metal powder may contain inevitable impurities without impairing the effects of the present invention.

The metal particles constituting the metal powder used in the present invention may have, for example, a spherical shape, a flat (flake-like) shape, a dendritic (branching tree-like) shape, a rod-like shape, or the like, and one of these shapes may be used alone, or a plurality of shapes of these shapes may be used in combination. The shape of the metal particles depends on the method for producing the metal particles. For example, spherical particles are likely to be obtained when a wet reduction process or an atomizing process is employed. Dendritic or rod-shaped particles are likely to be obtained when an electrolytic reduction process is employed. Flat particles can be obtained by, for example, plastically deforming spherical particles by applying a mechanical external force thereto. In the following description, metal particles having shapes other than spheres may also be collectively referred to as "non-spherical metal particles".

It is preferable that the metal powder contains flat metal particles. In this case, the volume-based cumulative particle size $D_{50}$ of the flat metal particles as measured at a cumulative volume of 50 vol % through particle size distribution analysis using a laser diffraction and scattering method is preferably 0.3 µm or more, more preferably 0.5 µm or more, and even more preferably 0.7 µm or more. Also, the particle size of the flat metal particles in terms of $D_{50}$ is preferably 100 µm or less, more preferably 70 µm or less, and even more preferably 50 µm or less. The metal powder containing particles with such a particle size makes it possible to form a densely sintered coating film while maintaining the above-described compressibility, and thus, high bonding strength between the conductors and an improvement in the electrical conduction reliability can be realized. A flat shape refers to a shape having a pair of plate surfaces that form the main surfaces of a particle and a side surface that intersects the plate surfaces, and the plate surfaces and the side surface may each independently be a flat surface, a curved surface, or an uneven surface.

$D_{50}$ can be measured using the following method, for example. More specifically, 0.1 g of a specimen to be measured is mixed with an aqueous solution of a dispersant and dispersed for one minute using an ultrasonic homogenizer (US-300T manufactured by Nihonseiki Kaisha Ltd.). After that, the particle size distribution is measured using a laser diffraction and scattering particle size distribution analyzer, for example, MT3300 EXII manufactured by MicrotracBEL Corp. This measurement method is also applicable to non-spherical metal particles, which will be described later.

In the case where the metal powder contains flat metal particles, the ratio of the length of the major axis a to the length of the minor axis b (hereinafter this ratio is also referred to as "aspect ratio (a/b)") of the flat metal particles is preferably 2 or more, and more preferably 5 or more. Also, the aspect ratio is preferably 80 or less, and more preferably 40 or less. The metal powder further containing particles with such a shape makes it possible to form a densely sintered coating film while maintaining the above-described compressibility, and thus, high bonding strength between the conductors and an improvement in the electrical conduction reliability can be realized.

The lengths of the major axis a and the minor axis b of the flat metal particles are obtained in the following manner. More specifically, while a particle to be measured is rotated 360 degrees in a direction parallel to its plate surface, imaginary circumscribed rectangles of 2D projections of the particle are examined, and the long side of a circumscribed rectangle that has a side with the longest length of all the circumscribed rectangles is used as the major axis a. On the other hand, while the particle to be measured is rotated 360 degrees in a direction perpendicular to its plate surface, imaginary circumscribed rectangles of 2D projections of the particle are examined, and the short side of a circumscribed rectangle that has a side with the longest length of all the circumscribed rectangles as its long side is used as the minor axis b. Similarly, the major axis a and the minor axis b of each of fifty or more randomly chosen particles are measured, and arithmetic mean values of the measured lengths are obtained.

Moreover, it is preferable that the metal powder contains dendritic metal particles in addition to, or instead of, the flat metal particles. The metal powder containing such particles forms a coating film with a bulky structure, and therefore, during pressure bonding, the effect of the variation in thickness of the conductors to be measured can be reduced even further, so that high bonding strength between the conductors can be realized. For example, dendritic particles disclosed in JP 2013-53347A can be used as the dendritic particles.

The particle size of the dendritic metal particles, in terms of $D_{50}$ as measured using the above-described method, is preferably 0.5 µm or more, more preferably 1 µm or more, and even more preferably 1.5 µm or more. Also, the particle size of the dendritic metal particles in terms of $D_{50}$ is preferably 100 µm or less, more preferably 50 µm or less, and even more preferably 30 µm or less. With the dendritic particles having a particle size within the above-described range, the oil absorption amount prescribed in JIS K5101 can be reduced, and the dispersibility of the particles can be improved. Accordingly, the concentration of the metal particles in the composition can be increased, and the number of contact points between the metal particles in the coating film can be increased. As a result, a dense sintered structure is likely to be formed when the coating film formed of the composition is sintered. In addition, control of the thickness of the bonding portion formed by sintering the coating film is also advantageously facilitated.

Moreover, it is preferable that the metal powder contains rod-shaped metal particles in addition to, or instead of, metal particles with the above-described shape(s). The particle size of the rod-shaped metal particles, in terms of $D_{50}$ as measured using the above-described method, is preferably 0.5 µm or more, more preferably 1 µm or more, and even more preferably 1.5 µm or more. Also, the particle size of the rod-shaped metal particles in terms of $D_{50}$ is preferably 100 µm or less, more preferably 75 µm or less, and even more preferably 50 µm or less. With the rod-shaped metal particles having a particle size within the above-described range, the oil absorption amount prescribed in JIS K5101 can be reduced, and the dispersibility of the particles can be improved. Accordingly, the concentration of the metal particles in the composition can be increased, and the number of contact points between the metal particles in the coating film can be increased. As a result, a dense sintered structure is likely to be formed when the coating film formed of the composition is sintered. In addition, control of the thickness of the bonding portion formed by sintering the coating film is also advantageously facilitated.

In the case where the metal powder contains rod-shaped metal particles, from the viewpoint of increasing the number of contact points between the metal particles and thereby making a dense sintered structure more likely to be formed during the sintering, the ratio of the length of the major axis a to the length of the minor axis c, that is, the aspect ratio (a/c) of the rod-shaped metal particles is preferably 3 or more, and more preferably 6 or more. Also, the aspect ratio is preferably 100 or less, and more preferably 50 or less.

The lengths of the major axis and the minor axis of the rod-shaped metal particles are obtained in the following manner. More specifically, while a particle to be measured is rotated 360 degrees in a direction parallel to its plate surface, imaginary circumscribed rectangles of 2D projections of the particle are examined, and the long side of a circumscribed rectangle that has a side with the longest length of all the circumscribed rectangles is used as the major axis a, and the short side of this circumscribed rectangle is used as the minor axis c. Note that the above-described major axis a, minor axis b, and minor axis c can be measured using, for example, Mac-View manufactured by Mountech Co., Ltd.

Moreover, it is preferable that the metal powder contains spherical metal particles in addition to, or instead of, particles having the above-described shape(s). The particle size of the spherical metal particles, in terms of the volume-based cumulative particle size $D_{SEM50}$ at a cumulative volume of 50 vol % as measured by analyzing an image observed under a scanning electron microscope, is preferably 30 nm or more, and more preferably 40 nm or more. Also, the particle size of the spherical metal particles in terms of $D_{SEM50}$ is preferably 200 nm or less, and more preferably 180 nm or less. With this configuration, the metal particles in the coating film can be sufficiently sintered even under conditions at a relatively low temperature, and the strength of the bonding portion formed by sintering the coating film can be increased.

$D_{SEM50}$ is obtained in the following manner. From a scanning electron microscope image of spherical metal particles, fifty or more particles are randomly chosen, and the particle size (Heywood diameter) of each of the particles is measured. Subsequently, based on the obtained particle size, the volume of the particle is calculated assuming that the particle is a perfect sphere, and, regarding the thus calculated volumes, the volume-based cumulative particle size at a cumulative volume of 50 vol % is obtained and used as $D_{SEM50}$.

Specifically, with the use of Mac-View manufactured by Mountech Co., Ltd., image data of the metal particles is loaded, then, fifty or more metal particles in the data are randomly chosen, and the particle size (Heywood diameter) of each particle, the area S of a 2D projection of each particle, and the peripheral length L of the 2D projection of each particle are measured. Subsequently, based on the obtained Heywood diameter, the volume of each particle is calculated assuming that the particle is a perfect sphere, and, regarding the thus calculated volumes, the volume-based cumulative particle size at a cumulative volume of 50 vol % is obtained and used as $D_{SEM50}$.

Whether or not metal particles are spherical is judged by calculating the circularity coefficient $4\pi S/L^2$ from the area S and the peripheral length L of each of the particles randomly chosen in the above-described method, and further calculating the arithmetic mean value of the calculated circularity coefficients. If the arithmetic mean value of the circularity coefficients is 0.85 or more, or preferably 0.90 or more, the metal particles are defined as being spherical.

It is more preferable that, of the above-described particle shapes, a combination of spherical metal particles with at least one of flat metal particles, dendritic metal particles, and rod-shaped metal particles, or more preferably a combination of spherical metal particles with flat metal particles, is contained in the metal powder. The use of such a combination of spherical metal particles with non-spherical metal particles makes it possible to reduce gaps between the particles and hence fill the metal particles with high density in the coating film, and thus, the number of contact points between the metal particles can be increased even more. As a result, a dense sintered structure is likely to be easily formed when the coating film formed of the composition is sintered, and the strength of the structure is thus improved even more.

The solid reducing agent contained in the composition for pressure bonding is solid at 1 atm. at room temperature (25° C.) and is used to promote sintering between the metal particles contained in the composition. For this purpose, it is advantageous that the solid reducing agent is a solid reducing agent with a chemical structure having at least one amino group and a plurality of hydroxyl groups. The use of a reducing agent with such a structure makes it possible to reduce oxidation of the metal particles during the sintering, when compared with a reducing agent that has a plurality of hydroxyl groups but does not have an amino group, and thus, a dense sintered structure in which the metal particles are sintered together can be obtained. The wording "solid at 1 atm. at room temperature (25° C.)" means that the melting point of the solid reducing agent at 1 atm. is higher than 25° C.

It is preferable that the melting point of the solid reducing agent is equal to or lower than the sintering temperature of the metal powder. It is also preferable that the boiling point of the solid reducing agent is higher than the boiling point of a liquid medium, which will be described later. When a solid reducing agent having such material properties is used, the solid reducing agent remains as a solid in the composition for pressure bonding during the drying of the composition for pressure bonding (when drying the coating film formed of the composition for pressure bonding to obtain a dried coating film), and melts during the sintering of the dried composition for pressure bonding (when sintering the dried coating film formed of the composition for pressure bonding). As a result, during the sintering of the coating film, even when a pressure is applied to the dried coating film formed of the composition for pressure bonding, the composition for bonding is unlikely to protrude from between the two conductors, and therefore, the control of the thickness is facilitated even more. Thus, a bonded structure with high bonding strength can be obtained. Furthermore, during the sintering of the dried coating film formed of the composition for pressure bonding, the reducing agent melts and spreads uniformly throughout the dried coating film, and therefore, the sintering of the metal powder is uniformly promoted. Thus, a bonded structure with an even denser sintered structure can be obtained which has high electrical conduction reliability. Note that the boiling point of the solid reducing agent is a temperature at 1 atm.

From the viewpoint of realizing both high bonding strength during the pressure bonding and high electrical conduction reliability after the pressure bonding, the solid reducing agent is preferably an amino alcohol compound, and more preferably an amino alcohol compound represented by the chemical formula (1) or (2) below. The term "amino alcohol compound" refers to an organic compound having at least one amine selected from primary to tertiary amines and at least one alcohol selected from primary to tertiary alcohols in a single chemical structure.

[Chem. 2]

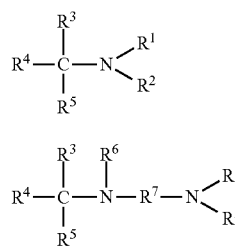

(1)

(2)

In the chemical formula (1) or (2), $R^1$ to $R^6$ each independently represent a hydrogen atom, a hydroxyl group, a hydrocarbon group having 1 to 10 carbon atoms, or a hydrocarbon group having 1 to 10 carbon atoms and having a hydroxyl group. The hydrocarbon group may be a saturated or unsaturated aliphatic group. This aliphatic group may be linear or branched. Examples of the hydrocarbon group for $R^1$ to $R^6$ include a methyl group, an ethyl group, and a propyl group.

In the formula (2), $R^7$ represents a hydrocarbon group having 1 to 10 carbon atoms or a hydrocarbon group having 1 to 10 carbon atoms and having a hydroxyl group. The hydrocarbon group may be a saturated or unsaturated aliphatic group. This aliphatic group may be linear or branched. Examples of the hydrocarbon group for $R^7$ include a methylene group, an ethylene group, a propylene group, and a butylene group.

In the chemical formula (1), at least two of $R^1$ to $R^5$ contain a hydroxyl group. That is to say, at least two of $R^1$ to $R^5$ are each a hydroxyl group or a hydrocarbon group having 1 to 10 carbon atoms and having a hydroxyl group. Also, in the formula (2), at least two of $R^1$ to $R^6$ contain a hydroxyl group. That is to say, at least two of $R^1$ to $R^6$ are each a hydroxyl group or a hydrocarbon group having 1 to 10 carbon atoms and having a hydroxyl group. In particular, in the chemical formula (1), it is preferable that at least two of $R^1$ to $R^5$ are each a hydrocarbon group having 1 to 4 carbon atoms and having a hydroxyl group. Also, in the chemical formula (2), it is preferable that at least two of $R^1$ to $R^6$ are each a hydrocarbon group having 1 to 4 carbon atoms and having a hydroxyl group. In this case, it is preferable that the hydroxyl group in the hydroxyalkyl group is bonded to the end of the alkyl group.

In the reducing agent represented by the chemical formula (1), from the viewpoint of improving the sinterability of the metal particles, it is preferable that three or more, more preferably four or more, or even more preferably all, of $R^1$ to $R^5$ contain a hydroxyl group. From a similar viewpoint, in the reducing agent represented by the chemical formula (2), it is preferable that three or more, more preferably four or more, and even more preferably four or more, of $R^1$ to $R^6$ contain a hydroxyl group.

Specific examples of the amino alcohol compound represented by the chemical formula (1) or (2) include: bis(2-hydroxyethyl)iminotris(hydroxymethyl)methane (BIS-TRIS, melting point: 104° C., boiling point: above 300° C., corresponding to the chemical formula (1)); 2-amino-2-(hydroxymethyl)-1,3-propanediol (TRIS, melting point: 169 to 173° C., boiling point: above 300° C., corresponding to the chemical formula (1)); and 1,3-bis(tris(hydroxymethyl)methylamino)propane (BIS-TRIS propane, melting point: 164 to 165° C., boiling point: above 300° C., corresponding to the chemical formula (2)). Of these compounds, bis(2-hydroxyethyl)iminotris(hydroxymethyl)methane (BIS-TRIS) is preferably used as the solid reducing agent, from the viewpoint of improving the sinterability of the metal particles and also obtaining a bonded structure that realizes high bonding strength between the conductors. Note that the melting points and the boiling points of the above-described compounds are the temperatures at 1 atm.

One of the above-described solid reducing agents may be used alone, or two or more thereof may be used in combination. In each case, the content ratio of the solid reducing agent in the composition for pressure bonding is preferably 0.1 parts by mass or more, and more preferably 1 part by mass or more, with respect to 100 parts by mass of the metal powder, from the viewpoint of improving the sinterability of the metal particles. Also, from the viewpoint of realizing favorable application performance to the conductors while maintaining the ratio of the metal powder in the composition for pressure bonding, the content ratio of the solid reducing agent is practically 10 parts by mass or less, preferably 8 parts by mass or less, and even more preferably 5 parts by mass or less, with respect to 100 parts by mass of the metal powder.

It is preferable that the composition for pressure bonding further contains a liquid medium having a boiling point of less than 300° C. at 1 atm. The composition for pressure bonding containing such a liquid medium has paste- or ink-like properties and can realize excellent ease of application of the coating film. From a similar viewpoint, it is preferable that the above-described liquid medium is liquid at 1 atm. at room temperature (25° C.). In the case where the composition for pressure bonding contains a liquid medium, it is also preferable that the liquid medium is a non-aqueous medium from the viewpoint of reducing oxidation of the metal powder.

It is preferable that the liquid medium is a monohydric or polyhydric alcohol, and more preferably a polyhydric alcohol, because such a liquid medium can impart ease of application to the composition for pressure bonding and also has appropriate volatility. Examples of the polyhydric alcohol include propylene glycol (boiling point: 188° C.), ethylene glycol (boiling point: 197° C.), hexylene glycol (boiling point: 197° C.), diethylene glycol (boiling point: 245° C.), 1,3-butanediol (boiling point: 207° C.), 1,4-butanediol (boiling point: 228° C.), dipropylene glycol (boiling point: 231° C.), tripropylene glycol (boiling point: 273° C.), glycerol (boiling point: 290° C.), Polyethylene glycol 200 (boiling point: 250° C.), and Polyethylene glycol 300 (boiling point: 250° C.). One type of liquid medium may be used alone, or two or more types may be used in combination. Among these, a liquid medium containing polyethylene glycol such as Polyethylene glycol 200 or Polyethylene glycol 300 is preferable because such a liquid medium can impart appropriate viscosity to the composition for pressure bonding, thereby improving the ease of application and the shape retention of the coating film, and can also improve the dispersibility of components in the composition for pressure bonding, thereby enabling a uniform and dense sintered structure to be obtained. Note that the boiling points of the aforementioned compounds are the temperatures at 1 atm.

In the case where the composition for pressure bonding contains a liquid medium, the liquid medium content is preferably from 10 parts by mass to 40 parts by mass, and more preferably from 10 parts by mass to 35 parts by mass, with respect to 100 parts by mass of the metal powder, from the viewpoint of imparting appropriate viscosity to the composition for pressure bonding and improving the shape retention of the coating film when the composition for bonding is applied to a conductor.

It is preferable that, when unheated, the composition for pressure bonding has a viscosity of 20 Pa·s to 200 Pa·s, and more preferably 25 Pa·s to 180 Pa·s, at a shear rate of 10 s$^{-1}$ and 25° C., from the viewpoint of improving the ease of application of the coating film to the conductor and the shape retention of the coating film. The viscosity of the composition for bonding can be measured with a rheometer (viscoelasticity measurement apparatus) using a sensor of a parallel-plate type.

The composition for pressure bonding may also contain other components as long as the effects of the present invention can be achieved. Examples of the other components include a binder component, a surface tension regulator, an antifoaming agent, and a viscosity modifier. With regard to the ratio of the other components, it is preferable that the total amount of the other components is 10 parts by mass or less, and more preferably from 0.1 parts by mass to 10 parts by mass, with respect to 100 parts by mass of the metal powder.

Next, a method for producing a bonded structure of conductors using the above-described composition for bonding will be described. This bonded structure is a structure in which two conductors are electrically connected to each other via a bonding portion formed by sintering the metal powder. The present production method is roughly divided into three steps: an application step of applying the composition for pressure bonding to a surface of a first conductor to form a coating film; a drying step of drying the coating film to form a dried coating film; and a pressure bonding step of stacking a second conductor on the dried coating film and performing pressure bonding.

First, the composition for pressure bonding is applied to the surface of the first conductor to form a coating film. There is no particular limitation on the means of application of the composition for bonding, and a known application means can be used. For example, screen printing, dispense printing, rotogravure printing, offset printing, or the like can be used. From the viewpoint of improving the printability, it is preferable that the composition for pressure bonding is a paste- or ink-like composition that contains a liquid medium. The coating film to be formed may be formed on the entire region of the surface of the first conductor, or may be discontinuously formed on the surface of the first conductor. In the case where the coating film is discontinuously formed on the surface of the first conductor, the first conductor is exposed at portions where the coating film is not formed.

From the viewpoint of forming a bonded structure that stably has a high bonding strength, the thickness of the coating film to be formed is preferably set to 1 µm to 500 µm, and more preferably 5 µm to 300 µm, immediately after the application.

Next, the formed coating film is dried to obtain a dried coating film. In the present step, at least a portion of the liquid medium is removed from the coating film through drying, and a dried coating film is thus obtained in which the amount of liquid medium in the coating film has been reduced. The shape retention of the dried coating film can be improved even more by removing the liquid medium from the coating film. In addition, a bulky coating film can be formed, and therefore, when sintering the dried coating film while applying a pressure thereto in the pressure bonding step, which will be described later, the effect of variations in the thickness of the conductors can be reduced by the coating film functioning as a cushioning material in the pressure application direction due to its bulkiness. As a result, the adhesion at each bonding portion can be improved, and high bonding strength can thus be realized. The dried coating film refers to a coating film in which the ratio of the liquid medium to the total mass of the film is 9 mass % or less. Except for the liquid medium, the amounts of constituent materials contained in the coating film are substantially equal to those in the dried coating film, which is obtained by drying the coating film. For this reason, the ratio of the liquid medium can be calculated by, for example, measuring a change in the mass of the coating film before and after the drying.

In order to remove the liquid medium through drying, the liquid medium can be volatilized using a drying method such as natural drying using the volatility of the liquid medium, hot air drying, infrared irradiation, or hot plate drying. The ratio of the liquid medium in the dried coating film after the removal of the liquid medium is, as described above, preferably 9 parts by mass or less, more preferably 7 parts by mass or less, and even more preferably 5 parts by mass or less, with respect to the total mass of the coating film, which is taken as 100 parts by mass. The present step can be modified as appropriate depending on the constituent components of the composition for pressure bonding. For example, the present step can be performed in an air atmosphere at a temperature of 60° C. to 150° C. under atmospheric pressure for 1 to 30 minutes.

Lastly, the second conductor is stacked on the dried coating film, and pressure bonding is performed. More specifically, after the dried coating film has been obtained through the above-described steps, the second conductor is stacked on the dried coating film to obtain a stack including the first conductor, the second conductor, and the dried coating film located therebetween. The first conductor and the second conductor may be made of the same type of material, or may be made of different types of materials. Moreover, the stack may further include a solid layer, such as a resin film, in addition to the first conductor, the second conductor, and the dried coating film, the solid layer being stacked on a surface of the conductor.

Then, a heating treatment is performed on the stack while applying a pressure thereto, to thereby sinter the metal powder contained in the dried coating film, and a bonding portion via which the first conductor and the second conductor are bonded together is thus formed. During the sintering, the atmosphere is preferably an inert gas atmosphere such as a nitrogen atmosphere. The sintering temperature is preferably less than 300° C., more preferably 150° C. or more and less than 300° C., even more preferably 200° C. or more and less than 300° C., and yet even more preferably 230° C. or more and less than 300° C. The pressure that is applied during the sintering is preferably 0.001 MPa or more, more preferably from 0.001 MPa to 20 MPa, and even more preferably from 0.01 MPa to 15 MPa. The sintering time is preferably 20 minutes or less, more preferably from 0.5 minutes to 20 minutes, and even more preferably from 1 minute to 20 minutes, on condition that the sintering temperature is within the above-described range.

The bonding portion that is formed through the above-described steps is formed by sintering the composition for pressure bonding, and is, more specifically, a sintered body of metal particles contained in the metal powder constituting the composition for pressure bonding. For example, in the case where copper is contained as the metal powder constituting the composition for pressure bonding, the bonding portion contains copper. Moreover, in the case where the solid reducing agent represented by the above-described chemical formula (1) or (2) is contained, a structure (3) below is formed in the bonding portion. The thickness of the bonding portion can be set so as to be within a similar range to that of the above-described thickness B of the sintered body.

[Chem. 3]

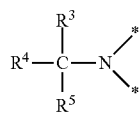

(3)

In the formula, $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group. Regarding the details of $R^3$ to $R^5$, the description of those in the chemical formulae (1) and (2) above applies as appropriate. In the formula, * represents a copper-binding site.

Whether or not the structure (3) is formed in the bonding portion can be checked by performing mass spectrometry (TOF-SIMS) or the like on a cross section of the bonding portion. For example, in the case where BIS-TRIS is used as the reducing agent, a fragment of molecular weight 152 attributed to C—N(Cu)$_2$ is observed in a TOF-SIMS mass spectrum on the cathode side.

A bonded structure of conductors having such a bonding portion can be favorably used in environments exposed to high temperatures, for example, in an in-vehicle electronic circuit or an electronic circuit in which a power device is implemented, by taking advantage of its characteristics such as high bonding strength and heat conductivity.

EXAMPLES

Hereinafter, the present invention will be described in greater detail using examples. However, the scope of the present invention is not limited to the examples below. Note that $D_{SEM50}$, $D_{50}$, and the aspect ratio (a/b) were measured in accordance with the above-described methods. Also, evaluation of the compressibility was performed in accordance with the above-described method.

Example 1

(1) Preparation of Composition for Pressure Bonding

Spherical copper particles (manufactured by Mitsui Mining & Smelting Co., Ltd.) having a $D_{SEM50}$ of 140 nm were used as the metal powder. The spherical copper particles used in this example were an assemblage of metal particles (Cu: 100 mass %) made substantially of copper. BIS-TRIS (manufactured by Dojindo Laboratories) was used as the solid reducing agent. A mixture of hexylene glycol (HG) (manufactured by Mitsui Chemicals, Inc.) and Polyethylene glycol 300 (PEG300) (manufactured by NOF CORPORATION) was used as the liquid medium. These materials were mixed to obtain a paste-like composition for pressure bonding. The contents of the metal powder, solid reducing agent, and liquid medium in the composition were set to the values shown in Table 1. Moreover, the composition for pressure bonding had a viscosity of 73.6 Pa·s at a shear rate of 10 s$^{-1}$ and 25° C.

Example 2

A composition for pressure bonding was produced in a similar manner to that of Example 1, except that the above-described spherical copper particles and flat copper particles ($D_{50}$: 4.9 μm, aspect ratio (a/b): 13.3; manufactured by Mitsui Mining & Smelting Co., Ltd.) were used as the metal powder, and the ratios of the constituent components were as shown in Table 1. As is the case with the spherical copper particles, the flat copper particles used in the present example were an assemblage of metal particles (Cu: 100 mass %) made substantially of copper. The composition for pressure bonding had a viscosity of 86.9 Pa·s at a shear rate of 10 s$^{-1}$ and 25° C.

Example 3

A composition for pressure bonding was produced in a similar manner to that of Example 2, except that the ratios of the constituent components were as shown in Table 1. The composition for pressure bonding had a viscosity of 66.0 Pa·s at a shear rate of 10 s$^{-1}$ and 25° C.

Example 4

A composition for pressure bonding was produced in a similar manner to that of Example 2, except that the ratios of the constituent components were as shown in Table 1. The composition for pressure bonding had a viscosity of 63.0 Pa·s at a shear rate of 10 s$^{-1}$ and 25° C.

Comparative Example 1

A composition for pressure bonding was produced in a similar manner to that of Example 2, except that, as the metal powder, the ratios of the constituent components were as shown in Table 1.

Example 5

A composition for pressure bonding was produced in a similar manner to that of Example 3, except that the spherical copper particles of Example 3 and dendritic copper particles ($D_{50}$: 6.8 µm; manufactured by Mitsui Mining & Smelting Co., Ltd.) were used as the metal powder, and the ratios of the constituent components were as shown in Table 2. As is the case with the spherical copper particles, the dendritic copper particles used in the present example were an assemblage of metal particles (Cu: 100 mass %) made substantially of copper. The composition for pressure bonding had a viscosity of 66 Pa·s at a shear rate of 10 s$^{-1}$ and 25° C.

(2) Production and Evaluation of Bonded Structures
(i) Production of Bonded Structures Copper plates (20 mm square, thickness: 2 mm) were used as first conductors. Metal masks were placed on center portions of the respective copper plates, and the compositions for pressure bonding of the examples and the comparative example were applied to the respective copper plates through screen printing, to form coating films. Each coating film was formed on a single portion with a size of 10 mm square. The coating films were dried in a hot air dryer in an air atmosphere at 110° C. under atmospheric pressure for 20 minutes to partially remove the liquid mediums, and then allowed to stand at room temperature. Thus, dried coating films were obtained. The thicknesses A (µm) of the obtained dried coating films were measured using Zygo NEXVIEW manufactured by Zygo Corporation. Table 1 shows the results.

Then, second conductors were stacked on the dried coating films to obtain stacks, and the stacks were subjected to a heating treatment under pressure to obtain bonded structures of the conductors. More specifically, alumina plates (5 mm square, thickness: 0.5 mm), each with a Cu film formed on a surface thereof and an Ag layer formed on a surface of the Cu film through Ag metallizing, were used as the second conductors. The alumina plates were placed on the respective dried coating films, and furthermore, fluororesin films (thickness: 50 µm) were placed on the second conductors, to obtain stacks. The stacks were treated in a nitrogen atmosphere at 280° C. for 20 minutes while applying a pressure of 6 MPa to the stacks. Thus, bonded structures of the conductors of the examples and the comparative example were obtained. The thicknesses B (µm) of sintered bodies were measured through observation under an SEM after polishing their cross sections. Table 1 shows the results. In addition, examination of a bonding cross section of the bonded structure of the conductors of each of the examples through mass spectrometry (TOF-SIMS) confirmed that a structure derived from copper and the solid reducing agent, which is represented by the structure (3) above, was formed.

Note that, in Comparative Example 1, the conductors were separated from the sintered body after the heating treatment under pressure, and therefore, the thickness B of the sintered body was measured in conformity with the method for measuring the thickness A (µm) of a dried coating film.

(ii) Evaluation of Bonding Strength of Bonding of Single Conductor (Single Bonding Strength)

To evaluate the single bonding strength, the shear strength of each of the obtained bonded structures was measured using a bond tester Condor Sigma manufactured by XYZ-TEC. The shear strength (MPa) is a value that is defined as breaking load (N)/bonding area (mm$^2$), and an arithmetic mean value of the results of three measurements is shown in Table 1 as the result. The higher the shear strength, the higher the bonding strength. A shear strength of more than 80 MPa is shown as ">80" in Table 1. Note that, for Comparative Example 1, since the conductors detached from the sintered body after the heating treatment under pressure, the bonding strength was zero. Moreover, the following evaluations were not performed for Comparative Example 1.

(iii) Evaluation of Bonding Strength of Collective Bonding of a Plurality of Conductors To evaluate the collective bonding strength, the following procedure was performed. A copper plate (20 mm square, thickness: 2 mm) containing a variation in thickness of 9.5 µm±0.5 µm was used as a first conductor. A metal mask was placed on a center portion of the copper plate, and a composition for pressure bonding was applied to the copper plate through screen printing to form four coating films each having a size of 5.5 mm square in a grid-like pattern such that the coating films did not overlap each other. These coating films were dried in a hot air drier in an air atmosphere at 110° C. under atmospheric pressure for 20 minutes to partially remove the liquid medium, and were then allowed to stand at room temperature. Thus, dried coating films were obtained.

Subsequently, alumina plates similar to those used in the step (i) were used as second conductors, and each of the alumina plates was placed on a center portion of corresponding one of the dried coating films. The thicknesses of these alumina plates were measured using a thickness gauge, and the alumina plates having the same thickness were used. After that, fluororesin films (thickness: 50 µm) were placed on the respective alumina plates, to obtain stacks. While a pressure of 6 MPa was simultaneously applied to the thus obtained four stacks, the four stacks were collectively subjected to a heating treatment under pressure in a nitrogen atmosphere at 280° C. for 20 minutes. Thus, a plurality of bonded structures were formed. After that, for all of the four bonded structures, the shear strength was measured using the method (ii) above. The lowest value of the shear strength (minimum shear strength) of the four bonded structures is shown in Table 1.

Note that, with regard to the thicknesses of the metal masks used in the above-described steps (i) and (iii), the metal masks having a thickness of 35 µm were used in Example 1, and the metal masks having a thickness of 100 µm were used in Examples 2 to 5 and Comparative Example 1. Therefore, the coating films prior to drying had a thickness of 35 µm in Example 1, and a thickness of 100 µm in Examples 2 to 5 and Comparative Example 1.

TABLE 1

| | Properties, materials, etc. | | Unit | Ex. 1 | Ex. 2 | Ex. 3 | Ex. 4 | Com. Ex. 1 |
|---|---|---|---|---|---|---|---|---|
| Composition | First metal powder | Shape | — | Spherical | Spherical | Spherical | Spherical | Spherical |
| | | Constituent | — | Cu (100 mass %) | Cu (100 mass %) | Cu (100 mass %) | Cu (100 mass %) | Cu (100 mass %) |
| | | Particle size $D_{SEM50}$ | Nm | 140 | 140 | 140 | 140 | 140 |
| | | Content | part by mass | 100 | 70 | 70 | 70 | 70 |
| | Second metal powder | Shape | — | — | Flat | Flat | Flat | Flat |
| | | Constituent | — | — | Cu (100 mass %) | Cu (100 mass %) | Cu (100 mass %) | Cu (100 mass %) |
| | | Particle size $D_{50}$ | Mm | — | 4.9 | 4.9 | 4.9 | 4.9 |
| | | Aspect ratio (a/b) | | — | 13.3 | 13.3 | 13.3 | 13.3 |
| | | Content | part by mass | 0 | 30 | 30 | 30 | 30 |
| | Liquid medium | HG | part by mass | 28.1 | 29.6 | 28.1 | 20.6 | 31.6 |
| | | PEG300 | part by mass | 1 | 1 | 1 | 1 | 0 |
| | Solid reducing agent | BIS-TRIS | part by mass | 2.5 | 1 | 2.5 | 10 | 0 |
| Bonded structure | Thickness A of dried coating film | | Mm | 29.8 | 51.6 | 64.1 | 36.5 | 64.9 |
| | Thickness B of sintered body | | Mm | 16.1 | 34.0 | 43.6 | 10.6 | *48.7 |
| | Compressibility | | % | 46.0 | 34.1 | 31.9 | 71.0 | 25.0 |
| Evaluation | Single bonding strength | Shear strength | MPa | >80 | >80 | >80 | >80 | 0 |
| | Collective bonding strength | Minimum shear strength | MPa | 23.9 | 24.5 | 40.2 | 59.5 | N/A |

*Measurement of thickness B of sintered body of Com. Ex. 1 was based on method for measuring thickness A of dried coating film.

TABLE 2

| | Properties, materials, etc. | | Unit | Ex. 5 |
|---|---|---|---|---|
| Composition | First metal powder | Shape | — | Spherical |
| | | Constituent | — | Cu (100 mass %) |
| | | Particle size $D_{SEM50}$ | nm | 140 |
| | | Content | part by mass | 70 |
| | Second metal powder | Shape | — | Dendritic |
| | | Constituent | — | Cu (100 mass %) |
| | | Particle size $D_{50}$ | μm | 6.8 |
| | | Aspect ratio (a/b) | | — |
| | | Content | part by mass | 30 |
| | Liquid medium | HG | part by mass | 28.1 |
| | | PEG300 | part by mass | 1 |
| | Solid reducing agent | BIS-TRIS | part by mass | 2.5 |
| Bonded structure | Thickness A of dried coating film | | μm | 75.0 |
| | Thickness B of sintered body | | μm | 40.8 |
| | Compressibility | | % | 45.6 |
| Evaluation | Single bonding strength | Shear strength | MPa | >90 |
| | Collective bonding strength | Minimum shear strength | MPa | 35 |

As shown in Tables 1 and 2, it was found that the compositions for pressure bonding of the examples and the bonded structures using these compositions, when compared with those of the comparative example, can realize very high and stable bonding strength of conductors even when a plurality of conductors were collectively and simultaneously pressure bonded. Moreover, although not shown in the tables, the compositions for pressure bonding of Examples 1 to 3, in which the solid reducing agent content was adjusted so as to be within a range of 1 to 8 parts by mass with respect to 100 parts by mass of the metal powder, exhibited particularly excellent application performance to the conductors.

INDUSTRIAL APPLICABILITY

According to the present invention, conductors can be sufficiently bonded together in a state of being unlikely to be affected by variation in thickness of the conductors to be bonded. As a result, when a plurality of bonding portions are collectively formed, high bonding strength can be stably realized.

The invention claimed is:

1. A composition for pressure bonding, comprising:
a copper powder;
a solid reducing agent; and
a liquid medium having a boiling point of less than 300° C. at 1 atm,
wherein the solid reducing agent has a chemical structure having at least one amino group and a plurality of hydroxyl groups,
a content ratio of the solid reducing agent is 0.1 parts by mass or more and 10 parts by mass or less with respect to 100 parts by mass of the copper powder,
the composition has a viscosity of 20 Pa·s to 200 Pa·s at a shear rate of 10 s$^{-1}$ and 25° C., and
the composition has a compressibility of 10% to 90%, the compressibility being expressed by:

Compressibility (%)=$((A-B)/A)\times 100$, wherein A represents a thickness of a dried coating film formed by drying the composition in an air atmosphere at 110° C. under atmospheric pressure for 20 minutes, and
B represents a thickness of a sintered body formed by treating the dried coating film in a nitrogen atmosphere at 280° C. under a pressure of 6 MPa for 20 minutes.

2. The composition for pressure bonding according to claim 1, wherein the copper powder contains flat particles.

3. The composition for pressure bonding according to claim 2, wherein
the flat particles have an aspect ratio a/b of 2 to 80, and
the aspect ratio a/b is defined by a ratio of a length of a major axis a of one of the flat particles to a length of a minor axis b of the one of the flat particles.

4. The composition for pressure bonding according to claim 1, wherein the copper powder contains dendritic particles.

5. The composition for pressure bonding according to claim 1, wherein the solid reducing agent is an amino alcohol compound.

6. The composition for pressure bonding according to claim 1, wherein the liquid medium contains polyethylene glycol.

7. The composition for pressure bonding according to claim 1, wherein
the solid reducing agent is an amino alcohol compound represented by one of formulas (1) and (2) below,

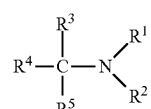

(1)

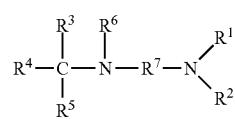

(2)

wherein each of $R^1$ to $R^6$ independently represents one of:
a hydrogen atom;
a hydroxyl group, a hydrocarbon group having 1 to 10 carbon atoms; and
a hydrocarbon group having 1 to 10 carbon atoms and having a hydroxyl group,
$R^7$ represents one of:
a hydrocarbon group having 1 to 10 carbon atoms; and
a hydrocarbon group having 1 to 10 carbon atoms and having a hydroxyl group,
in the formula (1), four or more of $R^1$ to $R^5$ contain a hydroxyl group, and
in the formula (2), four or more of $R^1$ to $R^6$ contain a hydroxyl group.

* * * * *